(12) United States Patent
Marutani

(10) Patent No.: US 10,797,214 B2
(45) Date of Patent: Oct. 6, 2020

(54) METHOD OF MANUFACTURING WIRING BOARD, METHOD OF MANUFACTURING LIGHT EMITTING DEVICE USING THE WIRING BOARD, WIRING BOARD, AND LIGHT EMITTING DEVICE USING THE WIRING BOARD

(71) Applicant: NICHIA CORPORATION, Anan-shi (JP)

(72) Inventor: Yukitoshi Marutani, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 15/599,543

(22) Filed: May 19, 2017

(65) Prior Publication Data

US 2017/0358725 A1     Dec. 14, 2017

(30) Foreign Application Priority Data

May 20, 2016   (JP) .................................. 2016-101765

(51) Int. Cl.
  *H01L 33/64*   (2010.01)
  *H05K 1/02*    (2006.01)
  (Continued)

(52) U.S. Cl.
  CPC ........ *H01L 33/647* (2013.01); *H01L 25/0753* (2013.01); *H05K 1/0204* (2013.01);
  (Continued)

(58) Field of Classification Search
  CPC ..... H01L 33/56; H01L 33/483; H01L 33/486; H01L 33/647; H01L 33/62; H01L 25/0753; H01L 33/44; H01L 33/46
  See application file for complete search history.

(56) References Cited

U.S. PATENT DOCUMENTS 6,515,233 B1 * 2/2003 Labzentis .............. H05K 3/243
                                                        174/254
8,823,023 B2 * 9/2014 Jinbo .................. H01L 27/1214
                                                        257/88
(Continued)

FOREIGN PATENT DOCUMENTS

JP        6-302864        10/1994
JP       10-193020         7/1998
(Continued)

*Primary Examiner* — Thanh Y. Tran
(74) *Attorney, Agent, or Firm* — Mori & Ward, LLP

(57) ABSTRACT

A method of manufacturing a wiring board according to one embodiment of the present disclosure includes: providing at least one first conductive member that serves as part of a wiring; covering the at least one first conductive member with an insulating member that has at least one opening; disposing at least one second conductive member on the opening of the insulating member, the second conductive member serving as part of the wiring; electrically joining the at least one first conductive member and the at least one second conductive member to each other at the opening; and cutting a region including the at least one first conductive member, the insulating member, and the at least one second conductive member, to form an element mounting surface.

20 Claims, 12 Drawing Sheets

(51) Int. Cl.
*H01L 25/075* (2006.01)
*H05K 3/46* (2006.01)
*H01L 33/62* (2010.01)

(52) U.S. Cl.
CPC ............ *H01L 33/62* (2013.01); *H01L 33/644* (2013.01); *H01L 2933/0066* (2013.01); *H01L 2933/0075* (2013.01); *H05K 3/4602* (2013.01); *H05K 2201/10106* (2013.01); *H05K 2203/0235* (2013.01)

(56) References Cited

U.S. PATENT DOCUMENTS

| | | |
|---|---|---|
| 2002/0132450 A1 | 9/2002 | Nose |
| 2004/0157410 A1* | 8/2004 | Yamaguchi ....... H01L 23/49805 438/460 |
| 2011/0133232 A1 | 6/2011 | Yoshioka et al. |
| 2013/0107467 A1* | 5/2013 | Kanno ................. H05K 3/4076 361/728 |
| 2013/0181236 A1* | 7/2013 | Tamaki ................... H01L 33/56 257/88 |
| 2015/0048505 A1* | 2/2015 | Kunimoto ......... H01L 23/49822 257/739 |
| 2015/0107667 A1* | 4/2015 | Tischler ................. H01L 24/96 136/257 |
| 2015/0353781 A1* | 12/2015 | Namiki ................. H01L 33/486 257/98 |
| 2016/0190395 A1* | 6/2016 | Shirahama ........... H01L 33/486 257/98 |
| 2016/0379938 A1* | 12/2016 | Kodani ................. H01L 23/562 257/668 |

FOREIGN PATENT DOCUMENTS

| | | |
|---|---|---|
| JP | 2002-270711 | 9/2002 |
| JP | 2002-270724 | 9/2002 |
| JP | 2002-270725 | 9/2002 |
| JP | 2002-270726 | 9/2002 |
| JP | 2002-314245 | 10/2002 |
| JP | 2007-27157 | 2/2007 |
| JP | 2007-214162 | 8/2007 |
| JP | 2007-227737 | 9/2007 |
| JP | 2007-273602 | 10/2007 |
| JP | 2007-273603 | 10/2007 |
| JP | 2008-235469 | 10/2008 |
| JP | 2010-135718 | 6/2010 |
| JP | 2010-186022 | 8/2010 |
| JP | 2015-111620 | 6/2015 |
| JP | 2016-004770 | 1/2016 |

* cited by examiner

90

METHOD OF MANUFACTURING WIRING BOARD, METHOD OF MANUFACTURING LIGHT EMITTING DEVICE USING THE WIRING BOARD, WIRING BOARD, AND LIGHT EMITTING DEVICE USING THE WIRING BOARD

CROSS-REFERENCE TO RELATED APPLICATION

This application claims priority to Japanese Patent Application No. 2016-101765, filed on May 20, 2016, the disclosure of which is hereby incorporated by reference in its entirety.

BACKGROUND

Field of the Invention

The present disclosure relates to a method of manufacturing a wiring board, a method of manufacturing a light emitting device using the wiring board, a wiring board, and a light emitting device using the wiring board.

Discussion of the Background

As printed wiring boards (PWBs) used for mounting semiconductor elements, various kinds of wiring boards are known, such as an aluminum-based single-sided board, and a CEM-3 copper clad board. For example, Japanese Unexamined Patent Publication No. 2016-4770 discloses a method of manufacturing a light source mounting wiring board in which a wiring pattern is formed by partially removing layered copper foil by etching.

SUMMARY

However, such a conventional PWB using copper foil is less likely to spread heat generated by a semiconductor element which consumes great power, such as a light emitting diode, over the copper foil. As a result, the temperature of the semiconductor element is increased, thereby degrading the performance thereof.

In manufacturing a PWB using copper foil, since a wiring pattern is formed by etching, resist waste liquid, etching waste liquid or other liquid is generated during the manufacture. Further, forming the wiring pattern by wet plating generates plating waste liquid. Treatments of such waste liquids lead to increased costs of conventional PWBs.

The present embodiments have been made in view of the above-mentioned circumstance, and an object of the present disclosure is to provide: a less costly method of manufacturing a wiring board for mounting a semiconductor element that consumes great power such as a light emitting element; a method of manufacturing a light emitting device using the wiring board; a light emitting element mounting wiring board with improved heat dissipation property; and a light emitting device using the wiring board.

A method of manufacturing a wiring board according to one embodiment of the present disclosure includes: providing at least one first conductive member that serves as part of a wiring; covering the at least one first conductive member with an insulating member that has at least one opening; disposing at least one second conductive member on the opening of the insulating member, the second conductive member serving as part of the wiring; electrically joining the at least one first conductive member and the at least one second conductive member to each other at the opening; and cutting a region including the at least one first conductive member, the insulating member, and the at least one second conductive member, to form an element mounting surface.

A wiring board according to one embodiment of the present disclosure includes: conductive bodies that serve as part of a wiring; and an insulating member that covers at least one part of at least one of lateral surfaces of the respective conductive bodies. The insulating member has at least one opening. Adjacent ones of the conductive bodies are joined to each other at respective ones of the openings.

Thus, a less costly method of manufacturing a wiring board for mounting a semiconductor element that consumes great power such as a light emitting element; a method of manufacturing a light emitting device using the wiring board; a light emitting element mounting wiring board with improved heat dissipation property; and a light emitting device using the wiring board are provided.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF EMBODIMENTS

Figure 1:
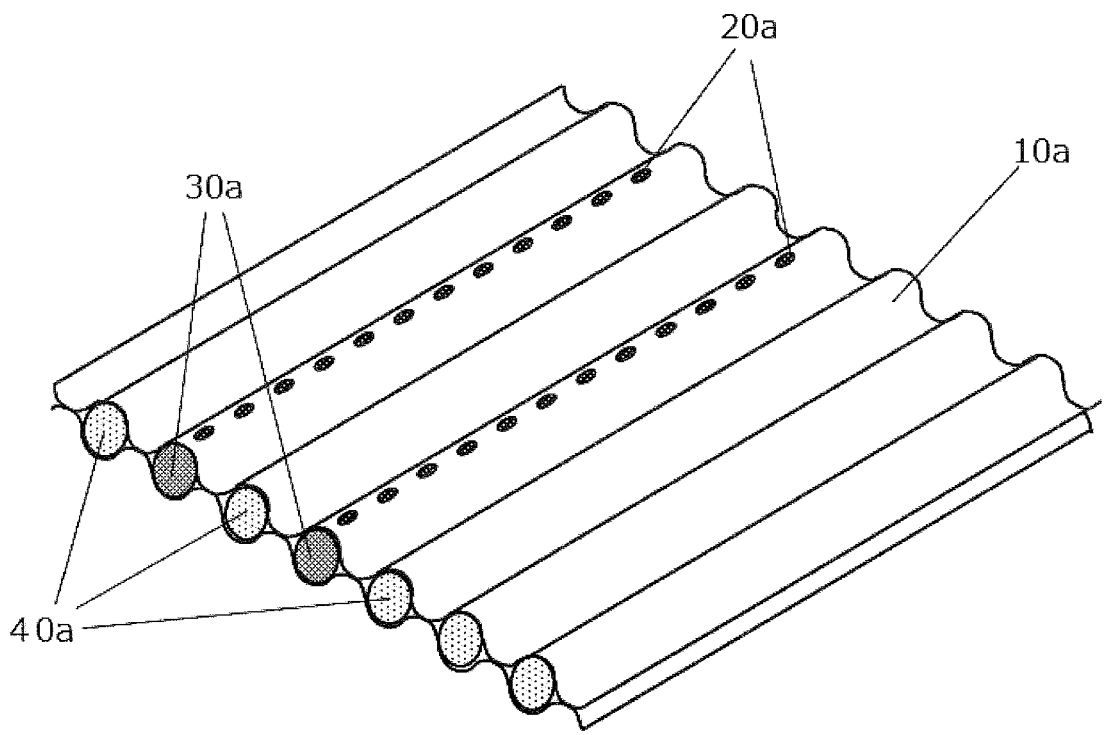
FIG. 1 is a schematic diagram showing a method of manufacturing a wiring board according to a first embodiment of the present disclosure.

In the following, a description will be given of embodiments of the disclosure with reference to the drawings as appropriate. A wiring board described in the following is for embodying the technical idea of the present disclosure. Unless otherwise specified, the present disclosure is not specified to the following. Further, the description provided in one embodiment or example is applicable to other embodiment or example. The size or positional relationship of the members in the drawings may be exaggerated for the sake of clarity.

First Embodiment

FIGS. 1 to 5 are schematic diagrams showing steps of manufacturing a wiring board 100 according to the present embodiment. FIG. 6 is a schematic diagram of the wiring board 100. The method of manufacturing a wiring board according to the present embodiment includes: providing at least one first conductive member; covering with an insulating member; disposing at least one second conductive member; and cutting.

Providing First Conductive Members

In providing one or more first conductive members, for example as shown in FIG. 1, a plurality of first conductive members 30a having a cylindrical columnar shape are provided. In the present embodiment, one or more spacer members 40a being similar in shape to the first conductive members are also provided in addition to the first conductive members 30a. In the present embodiment, the surface of each spacer member 40a is electrically insulated. Subsequently, for example, the first conductive members 30a and the spacer members 40a are arranged on a sheet-like insulating member in a predetermined cycle, so that lateral surfaces in a longitudinal direction of the first conductive members 30a and lateral surfaces in the longitudinal direction of the spacer member 40a are substantially parallel to each other. In FIG. 1, one spacer member 40a is disposed between two first conductive members 30a. On the outer sides of two of the first conductive members 30a also, the spacer members 40a are disposed.

Covering with Insulating Member

After the providing the first conductive members, for example in FIG. 1, the lateral surfaces in the longitudinal direction of the first conductive members 30a and the lateral surfaces in the longitudinal direction of the spacer members 40a are covered with a sheet-like flexible insulating member 10a provided with a plurality of elliptical openings 20a. Thus, the sheet-like flexible insulating member 10a is in contact with the lateral surfaces of the first conductive members 30a and the lateral surfaces of the spacer members 40a, while partially showing the lateral surfaces of the first conductive members 30a at the openings 20a. The openings 20a are formed at predetermined positions along the longitudinal direction on the first conductive members 30a in such a manner as to be spaced apart from each other.

Figure 2:
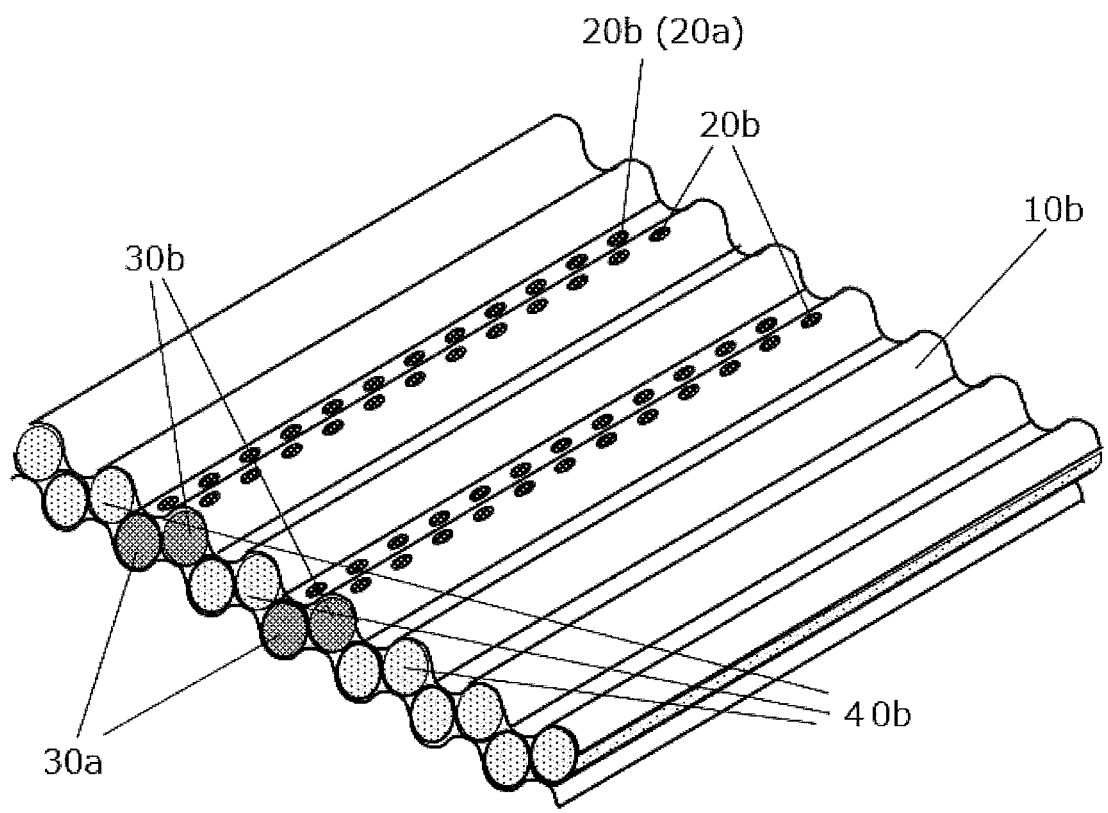
FIG. 2 is a schematic diagram showing the method of manufacturing a wiring board according to the first embodiment of the present disclosure.

Second Disposing Conductive Members and Covering with Insulating Member Performed Subsequently, as shown in FIG. 2, first conductive members 30b and spacer members 40b are disposed at positions on the insulating member 10a between adjacent first conductive member 30a and spacer members 40a. The first conductive members 30a are disposed as a first level in the disposing the first conductive members. The first conductive members 30b are disposed thereon as a second level via the insulating member 10a. There is no opening 20a positioned between the first conductive members 30a and the first conductive members 30b, therefore, electrical connection is not provided therebetween. Similarly to the covering with the insulating member, an insulating member 10b provided with openings 20b is disposed in such a manner as to cover the second-level first conductive members 30b and spacer members 40b. At this time, the insulating member 10b is disposed such that the openings 20b of the insulating member 10b that covers the second-level members are respectively overlaid on corresponding openings 20a of the insulating member 10a that covers the first-level members.

Disposing Second Conductive Members

Figure 3:
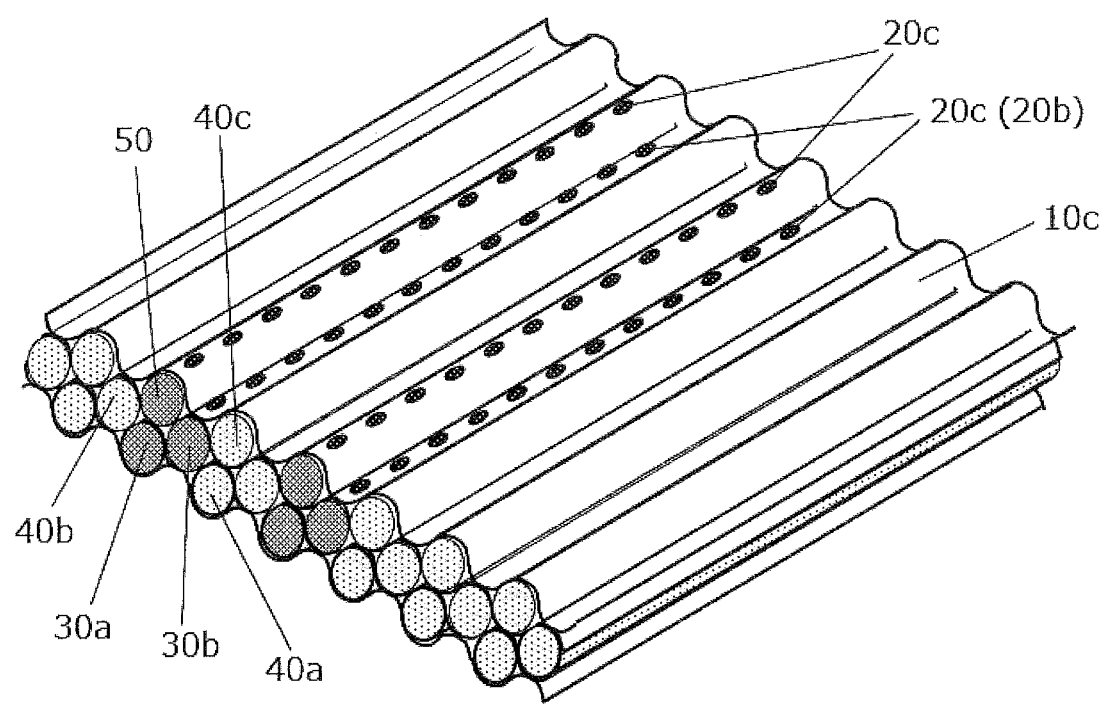
FIG. 3 is a schematic diagram showing the method of manufacturing a wiring board according to the first embodiment of the present disclosure.

After the covering with the insulating member, for example, second conductive members 50 being identical in material and shape to the first conductive members 30a, 30b are disposed at predetermined positions including above the openings 20a, 20b where the insulating member 10a and the insulating member 10b are overlaid on each other. At this time, the lateral surfaces in the longitudinal direction of the first conductive members 30a, 30b and the lateral surfaces in the longitudinal direction of the second conductive members 50 are positioned in such a manner as to be substantially parallel to each other. The first-level first conductive members 30a and a third-level second conductive members 50 are disposed so as to be in contact with each other via the openings. Again, one of spacer members 40c being substantially identical in shape to the second conductive members 50 may be disposed between the second conductive members 50. In FIG. 3, one spacer member 40c is disposed between two of the second conductive members 50. On the outer sides of two of the second conductive members 50 also, the spacer members 40c are disposed. Depending on the design of the wiring, the second conductive members 50, the spacer members 40c, and the first conductive members may be disposed at the third level.

In the present embodiment, although it has been described that the first conductive members 30a, 30b, the second conductive members 50, and the spacer members 40a, 40b, 40c are identical to one another in shape, they may not be identical in shape, and are need only be suitable for arranging and stacking. For example, they may be plate-like, hexagonal columnar, or other shape.

Figure 4A:
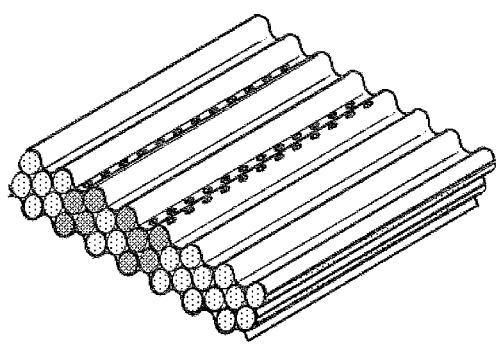
FIGS. 4A to 4C are schematic diagrams showing the method of manufacturing a wiring board according to the first embodiment of the present disclosure.
Figure 4B:
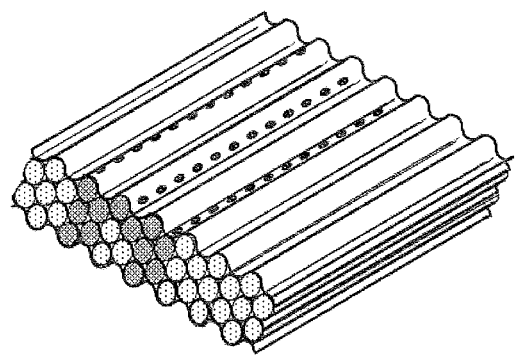
Figure 4C:
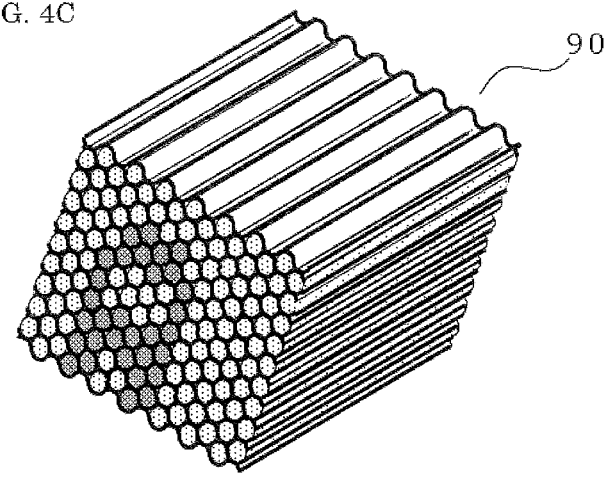

The first conductive members 30a are the conductive members (hereinafter, the first conductive members and the second conductive members may be collectively referred to as "the conductive members") that are provided and disposed before the covering with the insulating member, whereas the second conductive members 50 are the conductive members that are disposed on the openings 20a of the insulating member 10a after the covering with the insulating member. That is, the first conductive members 30a and the second conductive members 50 are disposed having the insulating member 10a and the openings 20a interposed between them. Herein, "the first" and "the second" are used relatively. That is, at the timing of completion of the disposing the conductive members which is performed after the disposing the second conductive members and thereafter the covering the insulating member, the conductive member referred to as "the second conductive members" in the foregoing are referred to as "the first conductive members". FIG. 2 shows the members after the covering with the insulating member performed twice. FIG. 3 shows the members after the covering with the insulating member performed third times. FIGS. 4A to 4C show the members after the disposing the second conductive members and the covering with the insulating member are repeatedly performed for a predetermined times. As shown in FIG. 4C, a layered body 90 is formed by bundling the plurality of conductive members and the spacer members.

Pressurizing

After the disposing the second conductive members and the covering with the insulating member are repeatedly performed for a predetermined times, for example, pressure is applied from the lateral surface sides and/or the top and bottom surface sides of the layered body 90 shown in FIG. 4C, to deform the conductive members and the spacer members, thereby reducing space inside the layered body 90. Thus, adjacent conductive members can be brought into contact with or connected to each other at the openings provided to the insulating members, and airtightness of the wiring board can be enhanced. As necessary, heating may be performed simultaneously with pressurizing. Suitable examples of the conductive members for pressurizing are soft metal wires such as copper-clad aluminum wires. The pressurizing may be performed after the layered body 90 is formed. Alternatively, the pressurizing may be performed after the disposing the second conductive members. In the present embodiment, the first-level first conductive members 30a and the third-level second conductive members 50 are brought into contact with or connected to each other as shown in FIG. 3. Alternatively, the first-level conductive members and the second-level conductive members may be brought into contact with or connected to each other. In the layered body 90 shown in FIGS. 4A to 4C, the conductive members and the spacer members are in the hexagonal closest-packed arrangement.

Joining

The method may include connecting electrically and mechanically adjacent at least one of the first conductive members 30a and at least one of the second conductive members 50 to each other through at least one of the openings 20a provided on the insulating member 10a. The first conductive member 30a and the second conductive member 50 can be joined to each other by appropriate joining technique, such as pressure-joining, fusing, soldering, or bonding with a conductive adhesive agent. According to the joining technique, joining conditions should be selected as appropriate, such as pressurizing, heating, drying and the like. The pressurizing described in the foregoing may serve as the joining.

A conductive joining member such as solder foil, solder paste, silver paste or the like may be disposed at each of the openings. The disposing the joining members may be performed between the covering with the insulating member and the disposing the second conductive members, in accordance with the joining technique. By the conductive members being joined to each other at the openings, the conductive members form part of a wiring.

In order to ensure the mechanical strength and heat dissipation of the wiring board, the plurality of spacer members may be connected to each other via the openings provided to the insulating member.

Cutting

Figure 5:
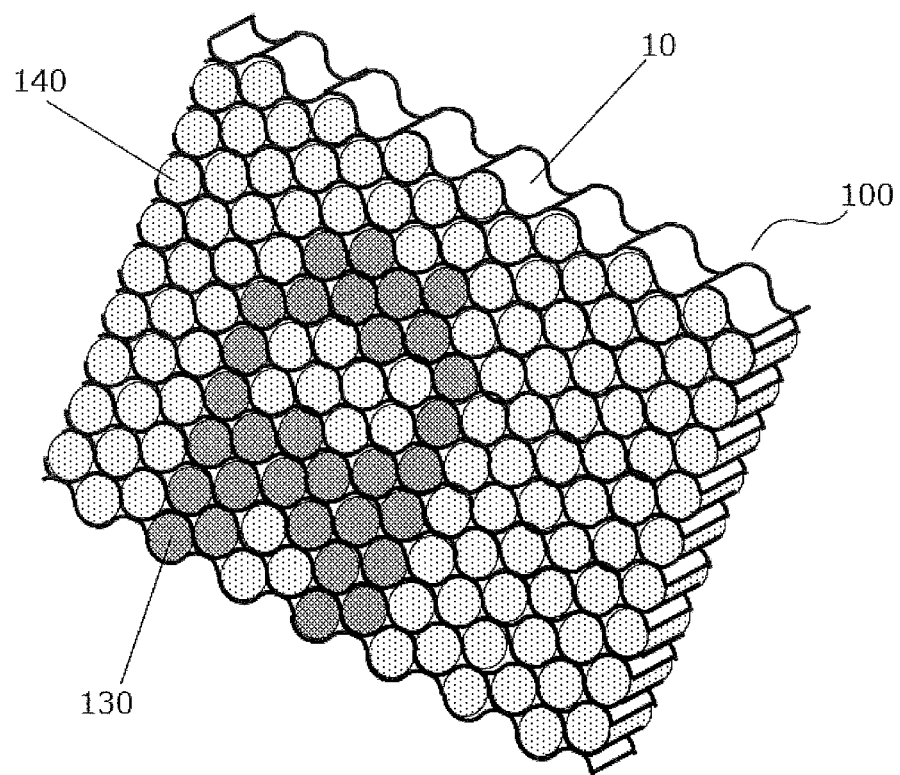
FIG. 5 is a schematic diagram of a wiring board formed by slicing a layered body shown in FIG. 4C.
Figure 6:
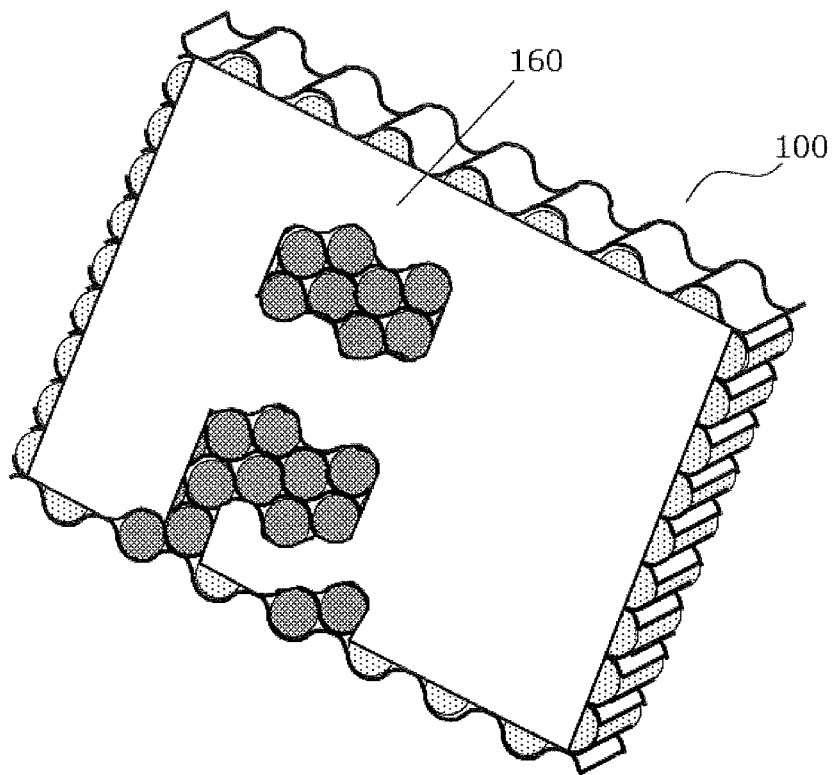
FIG. 6 is a schematic diagram of the wiring board shown in FIG. 5 provided with a light-reflecting insulating film on its surface.

In cutting, for example the layered body 90 subjected to the pressurizing and the joining shown in FIG. 4C is cut or sliced in a thickness of 1.6 mm, to obtain a wiring board 100 shown in FIG. 5. The cut layered body 90 may have a thickness in a range of about 0.5 mm to about 10 mm, for example. The cutting can be performed at an angle of about 90° relative to the center axis of the columnar first conductive members 30a, 30b, second conductive member 50, and spacer members 40a, 40b, 40c. Without being specified to about 90°, the cutting may be performed so that the center axis of the columnar first conductive members 30a, 30b, second conductive member 50, and the spacer members 40a, 40b, 40c and the cut surface intersect each other. Thus, the cut surfaces of a plurality of insulating members, conductive members and spacer members are exposed at the cut surface of the wiring board 100. The cutting provides, as shown in FIG. 5, the plate-like wiring board 100 in which the insulating members 10, conductive bodies 130, and spacer pieces 140 are disposed as being substantially flush with one another. The cut and exposed surface serves as the surface for mounting semiconductor elements such as light emitting elements.

Herein, the conductive bodies 130 are formed by the cutting or slicing first conductive members and second conductive members 50, and the spacer pieces 140 are formed by the cutting or slicing spacer members 40a, 40b, 40c. The cutting may be performed using a saw such as a circular saw, a Thomson blade or the like. The cutting may also be performed by slicing using laser processing. The cutting may include burr removing performed as a post-processing of the cutting.

Forming Metal Films

Metal films may be formed by plating, sputtering, or bonding metal foil at predetermined regions on the surface side where the semiconductor elements are mounted (hereinafter also referred to as "the front surface") or the back surface thereof, among exposed surfaces of the wiring board 100 exposed by the cutting. Since the metal films are connected to the semiconductor elements or the outside of the light emitting devices via connection terminals (e.g., connectors) or the like, the metal films are preferably made of a material being high in electrical conductivity and mechanical and electrical connectivity. In the case where light emitting elements are employed as the semiconductor elements are, the metal films are preferably made of a material having high in light-reflectivity (e.g., Ag). The metal films are not necessarily formed over all the conductive bodies. For example, the metal films may only need to be formed at necessary regions, such as the regions on which the semiconductor elements or the external connection terminals are mounted, or surrounding region of the foregoing. Forming the metal films is arbitrary. Depending on the material or structure of the conductive bodies, the metal films can be eliminated.

Forming Insulating Protective Coat

As shown in FIG. 6, an insulating protective coat 160 may be formed by, for example, applying or bonding, at a predetermined region of the surface side of the wiring board 100 where the semiconductor elements are mounted or its back surface. While not shown, an insulating protective coat is formed on the entire back surface of the wiring board 100 shown in FIG. 6 in order to reliably obtain an insulation distance (i.e., the creepage distance and the spatial distance) required for the wiring board. In the case where light emitting elements are employed as the semiconductor elements, the surface of the wiring board 100 preferably has the function of reflecting light. Examples of the insulating protective film 160 include B-stage epoxy resin containing white-color filler, white-color varnish, or a heat-resistant resin film containing white color filler (specifically, an aramid resin film, a polyamide-imide resin film, or the like) such as an adhesive layer-equipped white-color polyimide film. The insulating protective film 160 also serving as an insulating light reflecting film can be formed on a predetermined area of the surface of the wiring board where the semiconductor elements are mounted. The back surface of the wiring board 100 is preferably thermally conductive. For example, using a highly thermally conductive and electrically insulating sheet in which thermally conductive organic fibers are oriented in the thickness direction, or other material, an electrically insulating and highly thermally conductive layer serving as the insulating protective film 160 can be formed at a predetermined region of the back surface of the wiring board.

Mounting Light Emitting Elements

Figure 7:
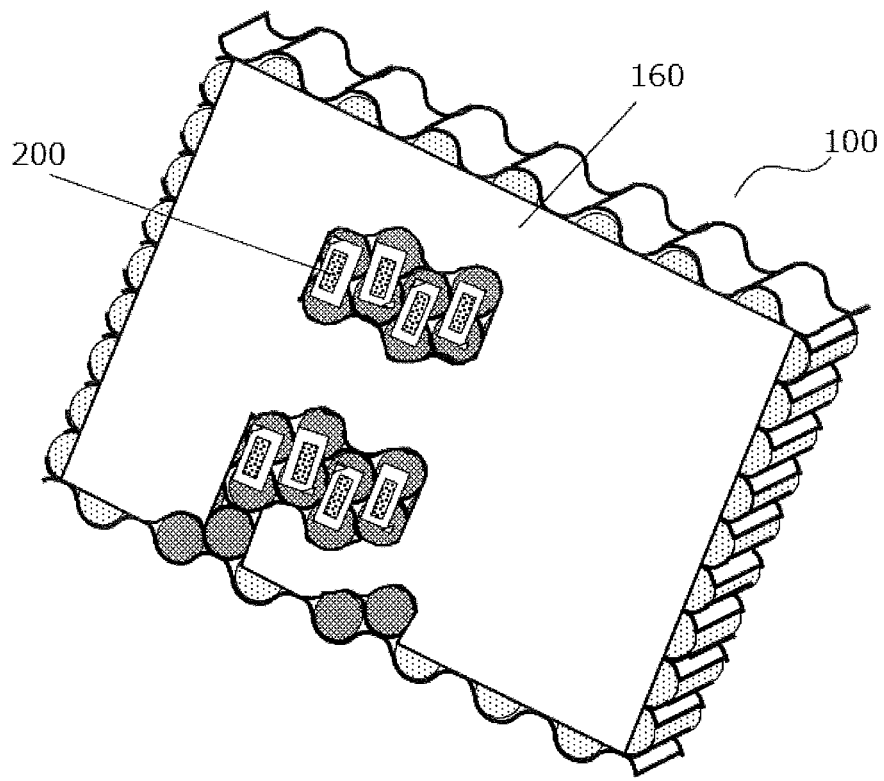
FIG. 7 is a schematic diagram showing the wiring board provided with the light-reflecting insulating film at a predetermined position shown in FIG. 6 on which light emitting elements (LEDs) are mounted.
Figure 8:
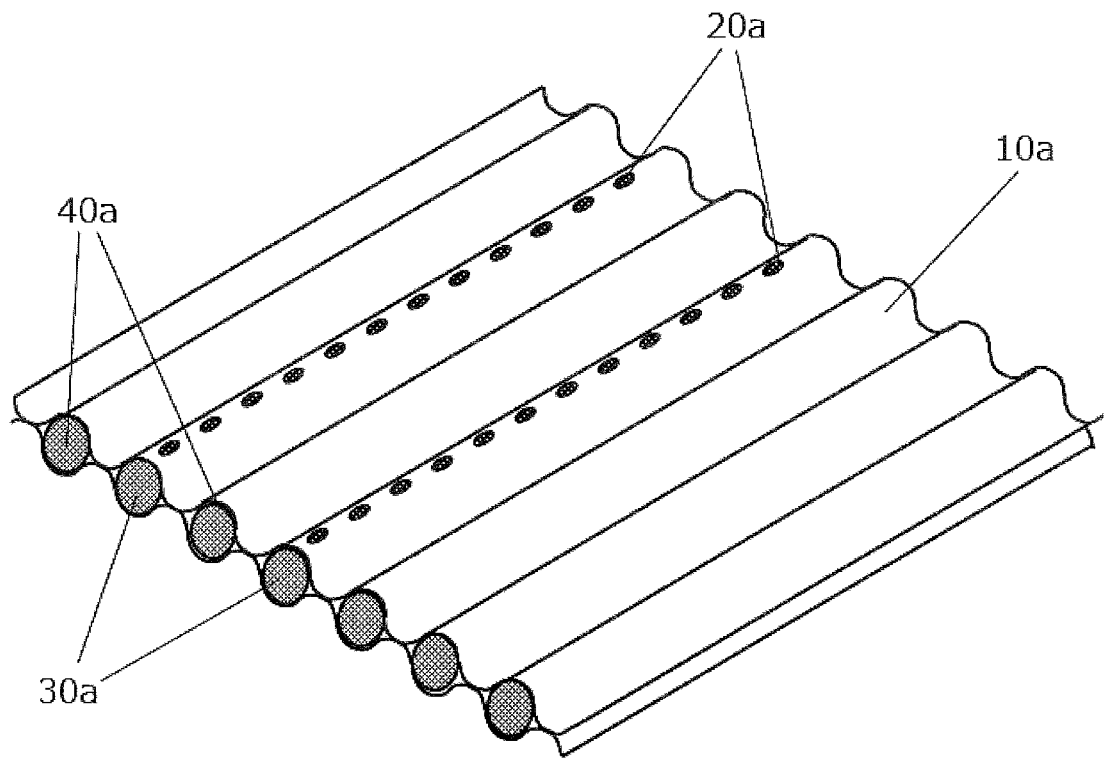
FIG. 8 is a schematic diagram showing a method of manufacturing a wiring board according to a second embodiment of the present disclosure.
Figure 9:
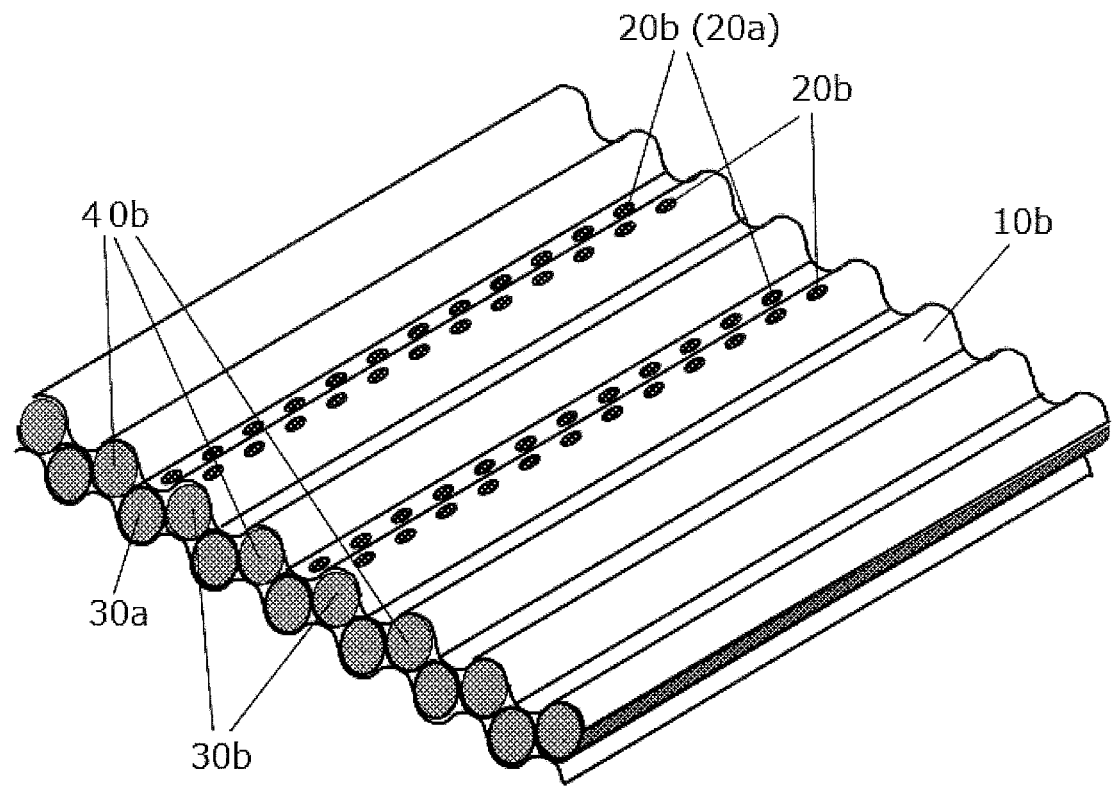
FIG. 9 is a schematic diagram showing the method of manufacturing a wiring board according to the second embodiment of the present disclosure.
Figure 10:
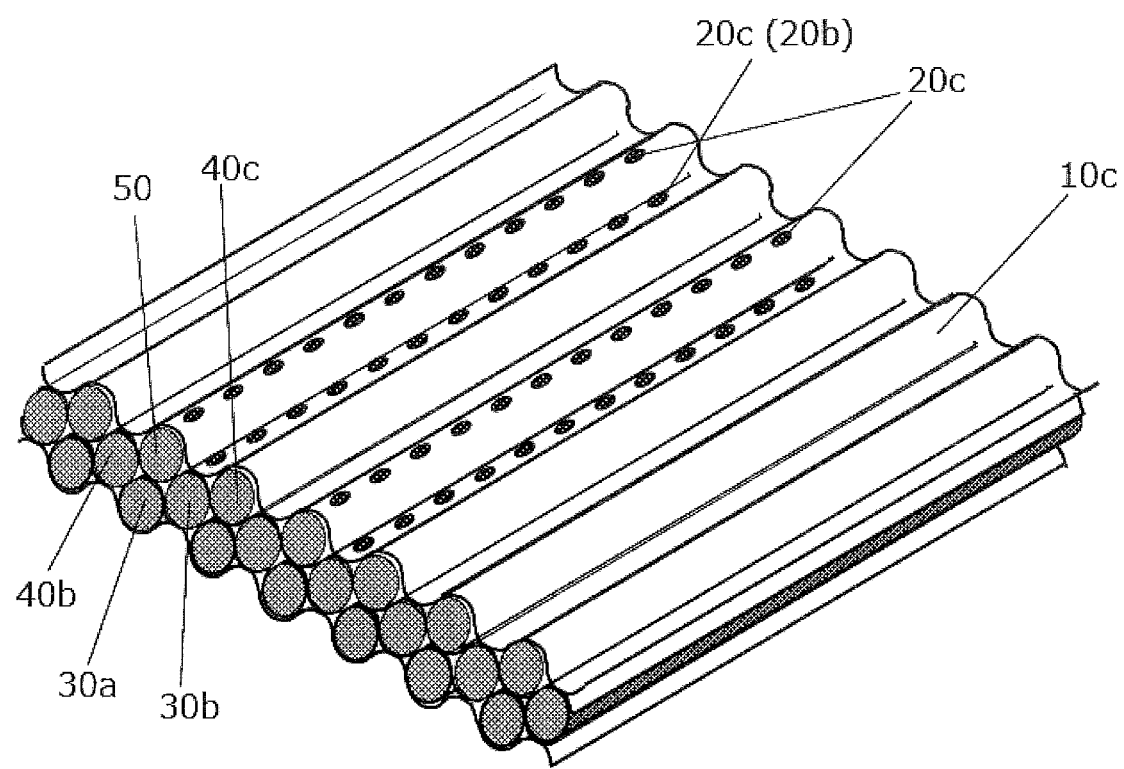
FIG. 10 is a schematic diagram showing the method of manufacturing a wiring board according to the second embodiment of the present disclosure.
Figure 11A:
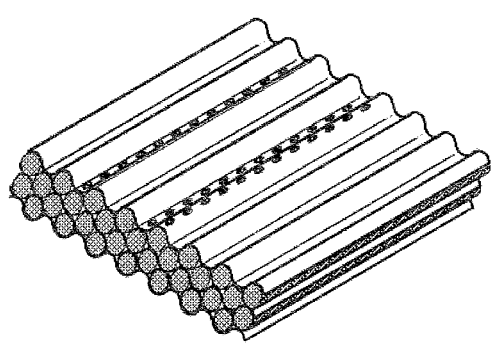
FIGS. 11A to 11C are schematic diagrams showing the method of manufacturing a wiring board according to the second embodiment of the present disclosure.
Figure 11B:
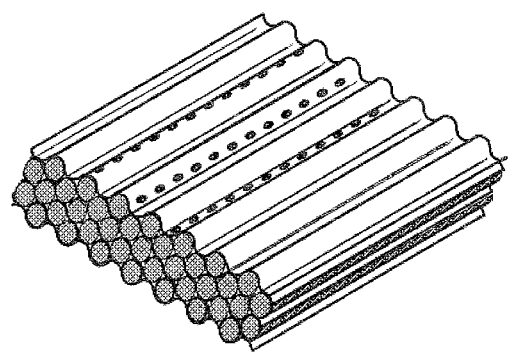
Figure 11C:
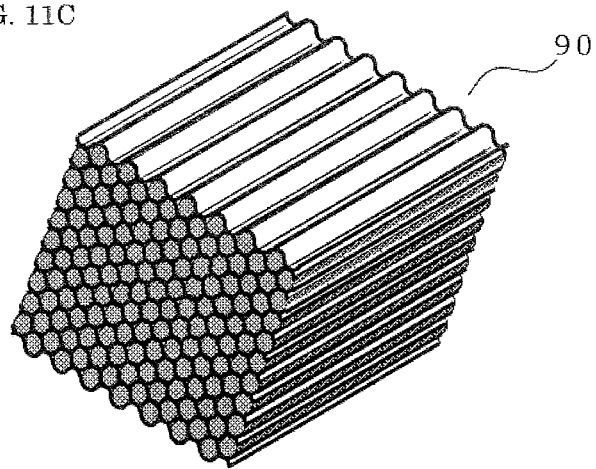
Figure 12:
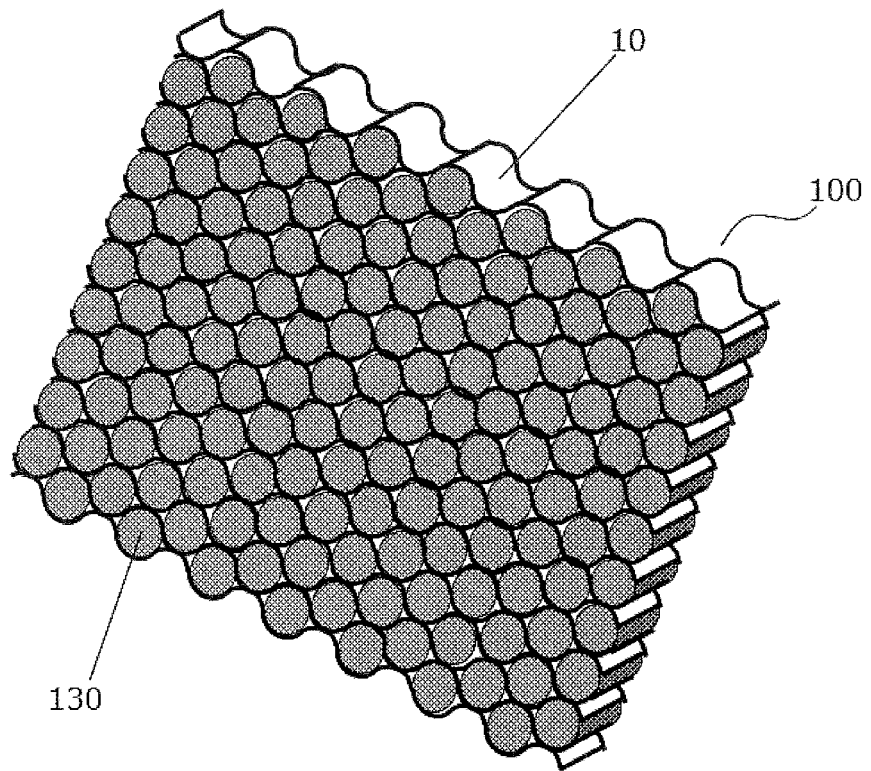
FIG. 12 is a schematic diagram of the wiring board formed by slicing the layered body shown in FIG. 11C.
Figure 13:
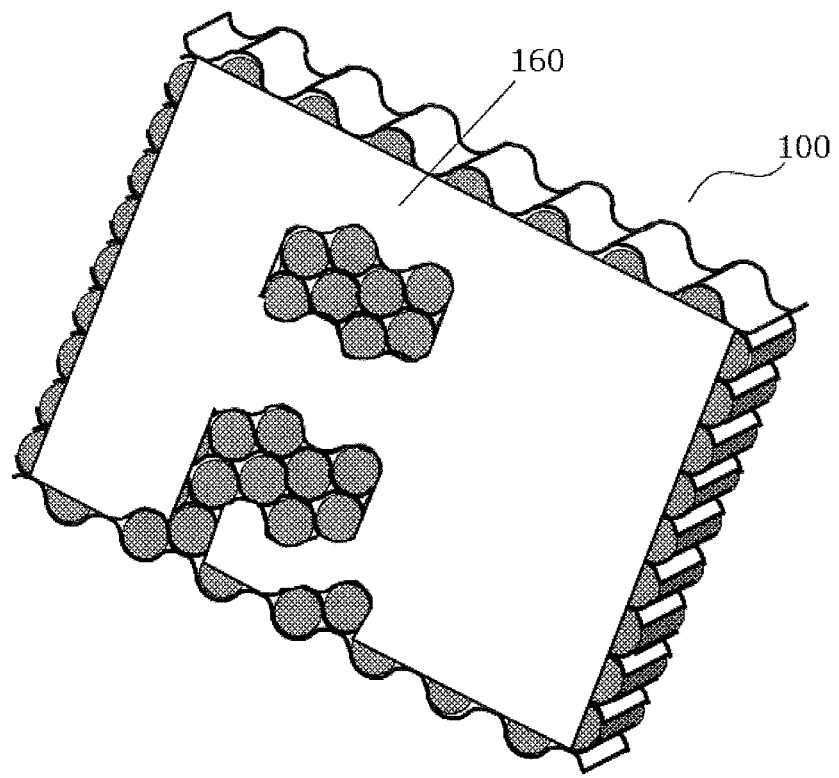
FIG. 13 is a schematic diagram of the wiring board shown in FIG. 12 provided with a light-reflecting insulating film on its surface.

On the insulating protective coat-equipped wiring board shown in FIG. 6 formed through the foregoing steps, light emitting elements 200 are mounted as shown in FIG. 7. In the present embodiment, as shown in FIG. 7, the light emitting elements 200 each having a pair of positive and negative electrodes on the side opposite to the light emission surface are mounted on the surface of the wiring board 100 on which semiconductor elements are mounted. The arrangement of the light emitting elements is two parallel-connected groups of light emitting elements 200, each of which group is made up of four series-connected light emitting elements 200, are arranged. At this time, at least one metal film formed on the conductive bodies 130 or the conductive bodies is/are each electrically connected to the positive and negative electrode of one light emitting element 200. Example manners of the conductive connection between the light emitting element mounting wiring board 100 and the light emitting elements 200 include solder, anisotropic conductive paste, or the like. Herein, the light emitting elements 200 may employ LED chips, or packaged LEDs.

With the wiring board 100 according to the present embodiment, by the conductive bodies 130 being as metal pieces, which are singulated by cutting the conductive members, are joined to each other to be a wiring via the opening of the insulating member 10 made of an insulating resin film or the like, thereby enabling formation of any wiring pattern. Thus, wiring of a plurality of light emitting elements 200 can be achieved. Further, by virtue of the conductive bodies 130 extending near the bottom surface of the wiring board 100, a wiring board can be obtained, which has low electrical resistance (i.e., good conductance), heat sink function, and good heat dissipation property.

The method of manufacturing a wiring board according to the present embodiment realizes manufacturing a wiring board without generating waste liquid or waste materials, which are generated in manufacturing a conventional printed wiring board (PWB) that includes etched metal foil or the like. Accordingly, the method according to the present embodiment reduces costs of treating wastes.

In the foregoing, the description has been given of a method of manufacturing a single-layer wiring board. Alternatively, a plurality of predetermined single-layer wiring boards may be joined to each other, to obtain a double-sided wiring board or a multilayer wiring board including two or more layers.

Second Embodiment

In a second embodiment, the first conductive members 30*a* and the second conductive members 50 are respectively layered on each other having the insulating member 10*a* provided with the openings 20*a* interposed therebetween, as shown in FIGS. 8 to 13. The second embodiment can be achieved by the same steps as the first embodiment except that the spacer members 40*a*, 40*b*, 40*c* are identical to the conductive members in material and shape.

According to the present embodiment, since the spacer members are conductive, a wiring board can have low electrical resistance and improved heat dissipation property.

Third Embodiment

Figure 14A:
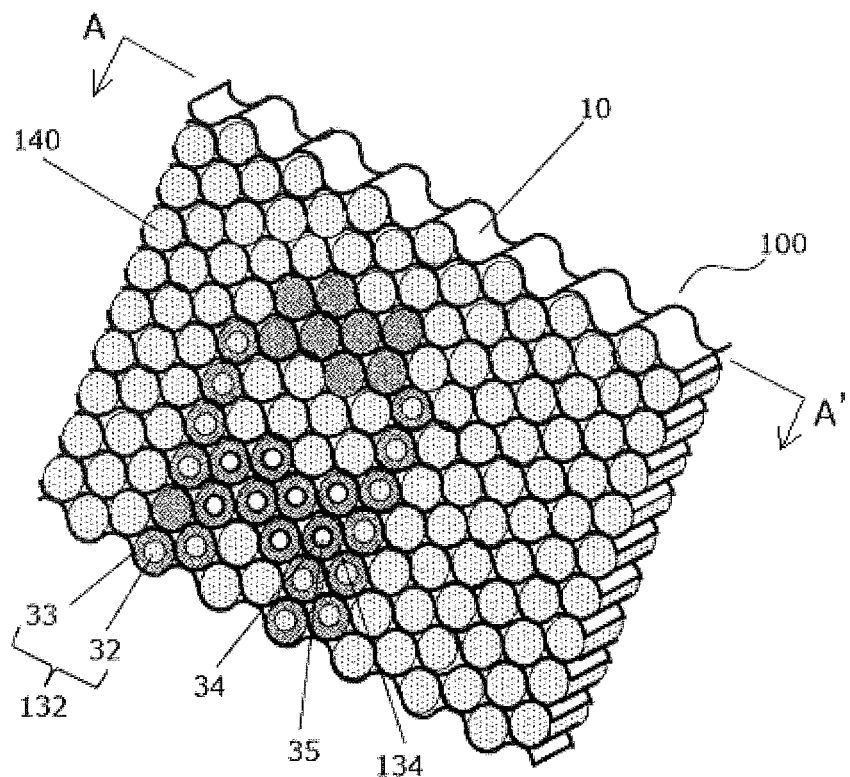
FIG. 14A is a schematic diagram showing a wiring board according to a third embodiment of the present disclosure.
Figure 14B:
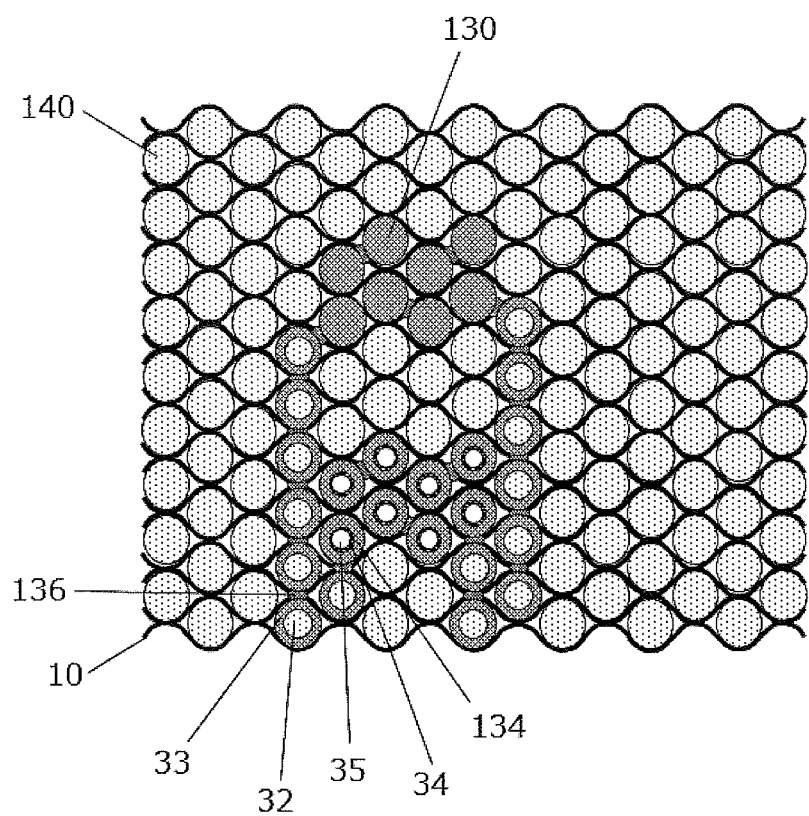
FIG. 14B is a cross-sectional view taken along line A-A' in FIG. 14A.

In a third embodiment, as shown in FIGS. 14A and 14B, as part of the conductive members forming a wiring, conductive members each being a round tube and/or a resin core provided with a metal layer on its outer side are disposed, to obtain a wiring board similarly to the first embodiment. In this manner, a reduction in weight is achieved. FIG. 14A is a perspective view of the wiring board according to the present embodiment. FIG. 14B is a cross-sectional view taken along line A-A' in FIG. 14A. By cutting the conductive members each including a resin core 32 provided with a metal layer 34 on the outer side of its lateral surface, resin core conductive bodies 132 can be obtained. By cutting the round tubes, through hole-including conductive bodies 134 are obtained. In the present embodiment, conductive joining members 136 made of solder or the like are respectively disposed on the openings provided on the sheet-like insulating member 10, therefore the conductive members are electrically connected to each other and serve as a wiring.

The through hole inner surface of each through hole-including conductive body 134 is conductive. Further, metal films 33 may be formed on the cut surfaces by plating. In this manner, a wiring board having through holes is obtained, and therefore lead components can be mounted. The term "components having leads" as used herein may refer axial components or radial components having leads that are inserted into the board or sockets, specifically, a bullet LED, a can package, a DIP, or the like.

Fourth Embodiment

In a fourth embodiment, a plurality of flat cables or flexible flat cables (FFC), each of which is a band-like bundle of conductive bodies each covered with a resin coat being an insulating member, and has its resin coat removed at predetermined regions to form openings where the conductive bodies (e.g., tin-plated round copper wire, tin-plated soft copper foil) are exposed are provided. The flat cables or flexible flat cables are oriented in an identical direction, layered and fixed, to form a layered body (i.e., bundle). By electrically connecting adjacent ones of conductive bodies to each other via the opening, and cutting or slicing the layered body (i.e., bundle), the surface of the wiring board where the semiconductor elements are to be mounted is formed.

In the first embodiment, the insulating member is overlaid on the conductive bodies to form the layered body. In the present embodiment, flat cables or flexible flat cables, in which the conductive bodies 130 are previously layered in such a manner as to be interposed between the insulating members 10, are overlaid to form the layered body.

Figure 15A:
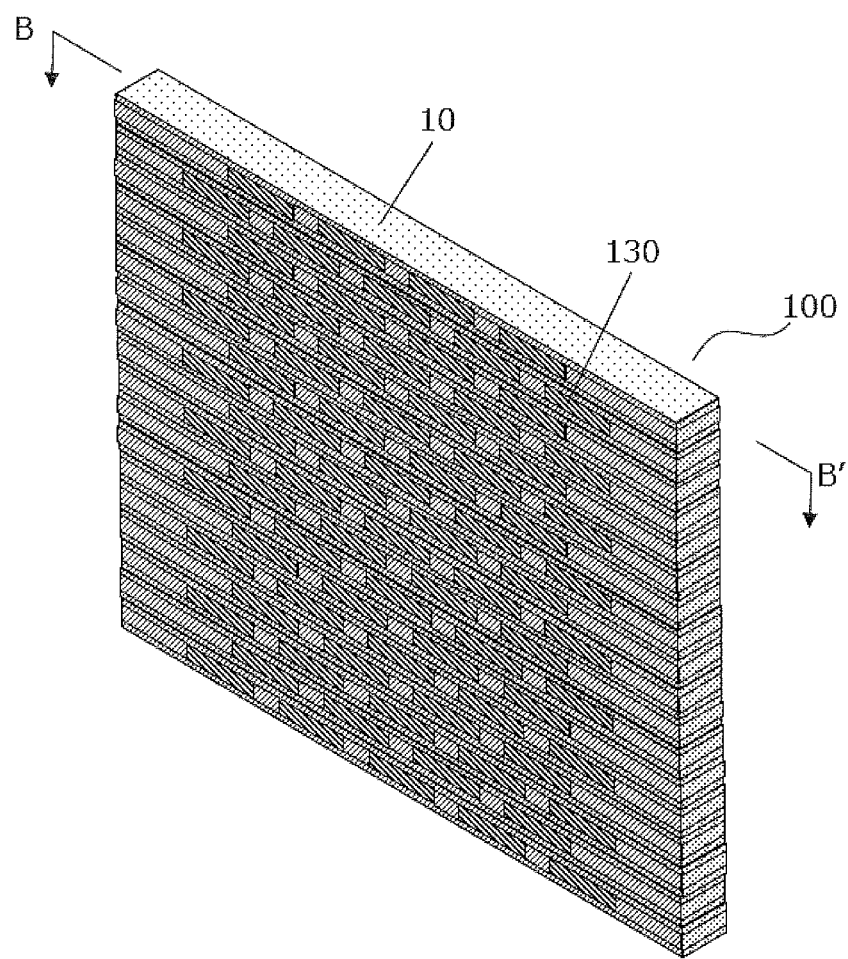
FIG. 15A is a schematic diagram showing a wiring board according to a fourth embodiment of the present disclosure.
Figure 15B:
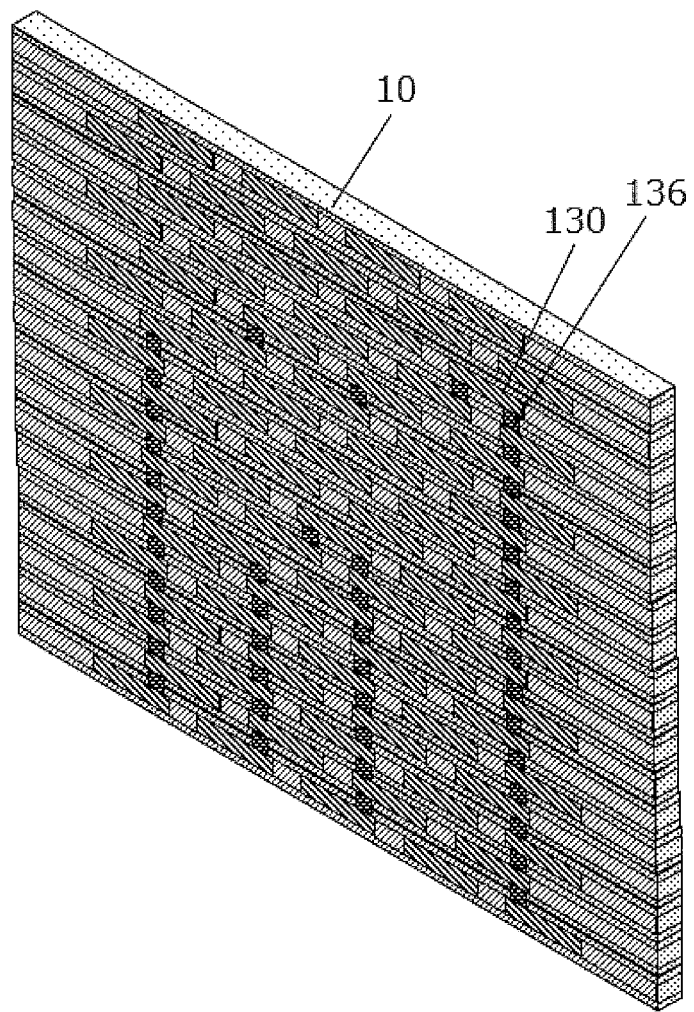
FIG. 15B is a cross-sectional view taken along line B-B' in FIG. 15A.

FIG. 15A shows the wiring board obtained by slicing the layered body according to the fourth embodiment. FIG. 15B is a cross-sectional view taken along line B-B' shown in FIG. 15A. The openings are formed on predetermined portions of the insulating members 10. By filling the openings with joining members 136 such as conductive paste, the conductive bodies 130 are formed as a wiring, thereby being electrically connected to each other.

The wiring board that is obtained by the manufacturing method according to the present embodiment exhibits the heat dissipation property and electrical conductivity that are equivalent to that of the wiring board obtained by the manufacturing method according to the first embodiment.

In the following, a description will be given of materials suitable for the members of the light emitting device according to the embodiments.

Insulating Member

The insulating member is preferably heat-resistant. Further, the insulating member is flame-retardant, having flame-retardant property of about V-0 or VTM-0 in the Flammability Standard UL 94. For example, the insulating member may be formed of an insulating resin film, an insulating resin coat, an insulating resin sheet, a ceramic green sheet applicable for LTCC or the like. The insulating member covers the lateral surfaces of the conductive members until the cutting. After the cutting, the insulating member covers the lateral surfaces of the conductive bodies. The insulating member may have a thickness in the range of 10 µm to 100 µm, for example. The surface of the insulating member may be adhesive, so as to be capable of tentatively fixing the conductive members and the insulating members disposed on the insulating member. The size of each opening provided to the insulating member may be, for example, 0.1 mm$^2$ or 1 mm$^2$. The opening may be greater than the width of the conductive member, and one opening may be formed across two or more conductive members and/or spacer members. Each opening may be in a desired shape such as circular, elliptical, angular, and the like.

In the case of the wiring board is for mounting light emitting elements, the insulating member is preferably made of a material that does not easily absorb light from the light emitting elements, nor easily deteriorate due to light or heat. The insulating member may contain filler, or the like and capable of reflecting light or shielding light.

Conductive Members

The first conductive members 30a, 30b and the second conductive members 50 are preferably columnar, in order to increase the number of the wiring board obtained by the cutting or slicing. The outer shape of the cross section of each columnar shape obtained by the cutting is preferably circular, elliptical, triangular, quadrangular, hexagonal, and the like. Such shape allows the conductive members to be layered with smaller space between each other, and thus reduces the interval between adjacent conductive members, which is preferable in joining the adjacent conductive members to each other. When the cross sectional outline of the columnar shape is circular, the conductive members are each a round wire. When the cross sectional outline is rectangular, the conductive members are each a flat wire. The conductive members are not specified to single wires, and may be stranded wires (e.g., stranded wires of tin-plated soft copper wires).

The conductive members preferably have a good electrical conductivity and a good thermal conductivity, and specifically made of a material, for example, copper, silver, aluminum, tin, gold, platinum, various kinds of solder, or alloy thereof. The conductive member is not necessarily formed of a uniform material unless high thermal conductivity is required, and may include a layered structure. In the case where the conductive member includes a layered structure, preferably the outer layer (i.e., the outermost layer) is made of a material having good electrical conductivity, while the inner layer is voids, or made of a lightweight material regardless of electrical conductivity (e.g., aluminum, resin), in view of weight reduction in the wiring board.

The surface of each conductive member is preferably smooth for obtaining the reduced surface area, which contributes to reducing formation of conductivity inhibiting substances such as oxides, and consequently contributes to establishing electrical connection. The surface may be plated to discourage formation of conductivity inhibiting substances such as oxides. The first conductive members and the second conductive members are not necessarily specified to be identical in material and structure. However, since they form part of a wiring, they both preferably have good electrical conductivity. In order to discourage galvanic corrosion, the surfaces of the first conductive members and the second conductive members are made of metal of the same kind.

Conductive Bodies

The conductive bodies 130 are formed by cutting or slicing the conductive members. Since the conductive bodies 130 are obtained by the cutting the conductive members, they may be formed of the same material as that of the conductive member described above.

The surface of each conductive body is desirably smooth to obtain the reduced surface area, which contributes to reducing formation of any conductivity inhibiting substance such as oxides, and consequently contributes to establishing electrical connection. The surfaces of the conductive bodies formed of the cross section of the conductive members on which semiconductor elements such as light emitting elements are mounted, desirably have good electrical connectivity with the semiconductor elements. The improved electrical connectivity can be obtained by forming metal films by plating or other technique on the surfaces of conductive bodies formed of the cross section of the conductive members on which semiconductor elements are mounted. That is, the surfaces of the conductive bodies are preferably high in solder wettability or easily alloyed with a solder material. The surfaces of the conductive bodies formed with the cross section of the conductive members, on which semiconductor elements are mounted, are preferably highly reflective to light emitted by the mounted light emitting elements, in view of improving light extraction efficiency. In order to improve light extraction efficiency, a light reflecting member may be provided as an underfill between the light emitting elements and the surfaces of the conductive bodies formed with the cross section of the conductive members.

Spacer Members, Spacer Pieces

The spacer pieces formed by cutting or slicing the spacer members are members that constitute the wiring board, and are disposed at the supporting part of the wiring board which does not pass current from wiring. Since the spacer members and the spacer pieces are not intended to pass current through, they may be insulating or conductive. The spacer pieces are preferably well bondable with the insulating member, have certain mechanical strength, and low density than the conductive members or conductive bodies (i.e., being lightweight). This can achieve wiring board being lightweight and having good strength to mechanical stress. For example, resin pieces obtained by the cutting or slicing resin wire being the spacer members can serve as the spacer pieces. In the present embodiment, it is not essential to include the spacer members or the spacer pieces. In the case where the semiconductor elements are packaged LEDs each having a heat sink not electrically connected at their bottom surfaces, the spacer member thermally connected to the heat sink and the spacer member adjacent thereto preferably have good thermal conductivity for dissipating heat of the semiconductor elements.

In the case where the wiring board is for mounting light emitting elements, the spacer pieces around the regions where the light emitting elements are mounted are preferably made of a material that does not easily absorb light from the light emitting elements, nor easily deteriorate due to light or heat. The spacer pieces preferably contain filler or the like, and are capable of blocking light, particularly capable of reflecting light.

Metal Films

The metal films are conductive films that are formed at predetermined regions of the cross-section of the conductive bodies and/or the spacer pieces, or the insulating members that are exposed on the cut or sliced surface of the layered body in which the insulating members, the conductive members, and the spacer member are layered. The metal films are formed at predetermined regions of the wiring board in order to improve the electrical connectivity between the wiring board and the semiconductor elements or the external connection terminals, and to improve light-reflectivity in the case where light emitting elements employ the semiconductor elements. In the case where the metal films are electrically connected to the semiconductor elements, the metal films preferably have good electrical conductivity and thermal conductivity. Specifically, each metal film preferably contains copper, silver, aluminum, tin, gold, platinum, various kinds of solder or the like in the outermost layer.

Insulating Light-Reflecting Layer

In the case where light emitting elements employ the semiconductor elements, in order to improve the light-reflectivity, the insulating light-reflecting layer covers the region irradiated with light from the light emitting elements, on the surface of the wiring board where the light emitting elements are mounted. Preferably, the insulating light-reflecting layer exhibits high reflectivity with respect to emission light wavelength of the light emitting elements mounted thereon. For example, the insulating light-reflecting layer is preferably set to exhibit a reflectivity of 70% or more with respect to the light emitted by the light emitting elements mounted thereon. Further, the insulating light-reflecting layer preferably has higher reflectivity with respect to the light emitted by the light emitting elements than the conductive bodies.

Insulating Protective Coat

The insulating protective coat for the front surface (where the semiconductor elements are mounted) and the back surface of the wiring board may be coating or a film-like or sheet-like semi-cured material of varnish, solder resist, permanent resist, or the like. In the case where the insulating protective coat is provided at the back surface of the wiring board, and part of the conductive bodies are exposed at the back surface, the insulating protective coat may be a photosensitive member, such as photosensitive film resist.

Example 1

A plurality of tin-plated copper wires (round wires) each having a diameter of 1.2 mm are provided as the first conductive members. The film-like insulating member having a thickness of 0.1 mm and other members are also provided. Subsequently, the tin-plated copper wires (round wires) are disposed at predetermined positions of the light-reflecting insulating film being the insulating member. The tin-plated copper round wires are arranged in parallel to each other at equal intervals (e.g., in a cycle of 2.3 mm, which is approximately equal to a value obtained by: multiplying the value of the diameter of the round wire by $\sqrt{3}$, then adding thereto the value twice as great as the value of the thickness of the insulating film). This is constitutes a hundred pieces of the tin-plated copper round wires, for example. The light-reflecting insulating film may be, for example, a bonding sheet made of B-stage epoxy resin. The bonding sheet may contain inorganic filler such as alumina, in order to enhance thermal conductivity.

The light-reflecting insulating film having openings with predetermined dimension and predetermined shape (for example, with a diameter of 0.4 mm, the area of about 0.126 $mm^2$) is disposed at predetermined positions of tin-plated copper wires (round wires). Thereafter, the openings are filled with solder foil or solder paste.

The tin-plated copper wires (round wires) being the second conductive members are disposed at predetermined positions of the light-reflecting insulating film covering the first conductive members. The tin-plated copper wires (round wires) are arranged in parallel to each other at equal intervals (for example, in a cycle of 2.3 mm). In this manner, the disposing the tin-plated copper wires and the covering with the light-reflecting insulating film are repeatedly performed for a predetermined times, to form a layered body (bundle) of the tin-plated copper wires (round wires) and the light-reflecting insulating films. In the cross section of the layered body, the tin-plated copper wires (round wires) are arranged at triangular grid points, and are in the hexagonal closest-packed arrangement. The light-reflecting insulating film is present between one tin-plated copper wire (round wire) and one tin-plated copper wire (round wire). The openings of the light-reflecting insulating film are at predetermined positions on the tin-plated copper wires (round wires). The round wires being adjacent to each other sandwich the solder foil or the solder paste between them at the openings.

Pressure is applied to the layered body from outer surface. For example, the layered body is held in a heated state, for example at 100° C. to 200° C. for a half to several hours to cure the light-reflecting insulating films. Thus, the layered body is fixed. By sufficiently pressurizing, the cross-sectional shape of the tin-plated copper wires (round wires) changes from circular to hexagonal, gaps are likely to be eliminated in the layered body. This improves airtightness of the wiring board obtained by cutting the layered body.

The solder foil or solder paste is melted by application of heat that is enough to melt solder, and thereafter cooled. Thus, the tin-plated copper wires being adjacent to each other at the openings of the light-reflecting insulating film are electrically connected to each other via the solder. The layered body is heated preferably in a nitrogen atmosphere containing hydrogen (a reducing atmosphere), in order to discourage the solder from being oxidized.

Thereafter, the layered body is cut or sliced at predetermined positions in a thickness of 1.6 mm, to form the wiring board. The cutting is performed at approximately 90° relative with respect to the center axis of the tin-plated copper wires. In the wiring board, a plurality of conductive bodies (metal pieces obtained by the cutting the tin-plated copper wires), which are solid from the upper surface (front surface) of the wiring board to the lower surface being the back surface, are fixed with at least part of their outer perimeter being covered with the insulating member. Further, the metal pieces facing through one opening of the insulating member inside the wiring board are joined to each other at the opening to form a wiring. Here, the area of the opening can be greater than the cross-sectional area of the plating layer or the metal foil on the surface of the conventional PWB. The electrical resistance of the wiring joined using the metal pieces can be smaller than that of the wiring of the conventional PWB. Further, the mechanical strength of the wiring also improves.

Current is passed through the wiring, via the metal pieces exposed at predetermined regions on the upper and lower surfaces of the wiring board by the cutting or slicing. Thus, the metal pieces are subjected to electroconductive plating (e.g., Ni/Ag by electroplating), to form a metal film-equipped wiring board. As compared to the electroless plating, the electrolytic plating (i.e., electroplating) can be conducted in a shorter time and at lower costs, and provides good appearance of the finished target with low electrical resistance. Further, the electrolytic plating can be conducted at lower plating temperatures, and thus can be easily applied to various materials.

The surface of each metal piece (the cross section of each tin-plated copper wire) not being subjected to electroplated is covered with an insulating light-reflecting layer, which is formed, for example, by a light-reflecting insulating resin coat such as white-color varnish.

After the insulating light-reflecting layer is formed, each of the light emitting elements as the semiconductor element is mounted on the surfaces of a predetermined pair of (plated) metal pieces on the upper surface of the wiring board. The electrical connection techniques between the plated metal piece surfaces and the light emitting element may be soldering, conductive paste, bump connection, or the like.

The present disclosure is applicable to, for example, a wiring board used for LED lighting.

What is claimed is:

1. A method of manufacturing a wiring board comprising:
providing at least one first conductive member that serves as part of a wiring, a shape of the at least one first conductive member being columnar;
covering the at least one first conductive member with an insulating member that has at least one opening;
disposing at least one second conductive member on the opening of the insulating member, the second conductive member serving as part of the wiring, a shape of the at least one second conductive member being columnar;
electrically joining the at least one first conductive member and the at least one second conductive member to each other at the opening; and
cutting a region including the at least one first conductive member, the insulating member, and the at least one second conductive member, to form an element mounting surface.

2. The method of manufacturing the wiring board according to claim 1, wherein
the insulating member has a plurality of the openings, and the cutting is performed between adjacent ones of the openings.

3. The method of manufacturing the wiring board according to claim 1, wherein
in the disposing the at least one second conductive member, the at least one second conductive member is disposed such that a lateral surface in a longitudinal direction of the at least one first conductive member and a lateral surface in a longitudinal direction of the at least one second conductive member are substantially parallel to each other, and the cutting is performed in such a manner as to cross the longitudinal direction.

4. The method of manufacturing the wiring board according to claim 1, further comprising,
after disposing the at least one second conductive member, applying pressure to the at least one first conductive member, the insulating member, and the at least one second conductive member.

5. The method of manufacturing the wiring board according to claim 1, further comprising
forming a metal film at respective exposed surfaces of the at least one first conductive member and the at least one second conductive member that are exposed by the cutting.

6. A method of manufacturing a light emitting device comprising
mounting a light emitting element on the wiring board according to claim 1.

7. The method of manufacturing the wiring board according to claim 1, further comprising
disposing, before the cutting of the region to form the element mounting surface, at least one spacer member adjacent to the at least one first conductive member and/or the at least one second conductive member.

8. The method of manufacturing the wiring board according to claim 7, wherein
the at least one spacer member has a same shape as the at least one first conductive member and/or the at least one second conductive member.

9. The method of manufacturing the wiring board according to claim 7, wherein
the at least one spacer member has a same shape as the at least one first conductive member and the at least one second conductive member, and
the at least one spacer member, the at least one first conductive member, and the at least one second conductive member each longitudinally extend in parallel to each other.

10. The method of manufacturing the wiring board according to claim 7, wherein
a surface of the at least one spacer member is electrically insulated.

11. The method of manufacturing the wiring board according to claim 1, further comprising
removing burrs after the cutting of the region to form the element mounting surface.

12. The method of manufacturing the wiring board according to claim 1, wherein
the cutting of the region to form the element mounting surface includes cutting through each of the at least one first conductive member, the insulating member, and the at least one second conductive member.

13. The method of manufacturing the wiring board according to claim 1, wherein
the at least one first conductive member, before the cutting of the region to form the element mounting surface, being elongated along a first center axis to form the columnar shape, and
the at least one first conductive member having a first outer shape of a cross section taken perpendicular to the first center axis, the first outer shape being circular, elliptical, triangular, quadrangular, or hexagonal.

14. The method of manufacturing the wiring board according to claim 13, wherein
the at least one second conductive member, before the cutting of the region to form the element mounting surface, being elongated along a second center axis to form the columnar shape, and the at least one second conductive member having a second outer shape of a cross section taken perpendicular to the center axis, the second outer shape being a same as the first outer shape.

15. A wiring board comprising:

conductive bodies that serve as part of a wiring;

an insulating member that covers at least one part of at least one of lateral surfaces of the respective conductive bodies; and a spacer member adjacent to at least one conductive body of the conductive bodies, a surface of the spacer member being electrically insulated, wherein the insulating member has at least one opening, wherein adjacent ones of the conductive bodies are joined to each other at the at least one opening, wherein an upper surface of each of the conductive bodies and an upper surface of the insulating member are substantially flush, and wherein the upper surface and the lower surface of the each of the conductive bodies are exposed.

16. The wiring board according to claim 15, further comprising a metal film provided on or above a surface of the conductive bodies.

17. A light emitting device comprising:

the wiring board according to claim 16; and at least one light emitting element mounted on the wiring board.

18. The wiring board according to claim 15, wherein the upper surface of each of the conductive bodies and the upper surface of the insulating member are coplanar.

19. A wiring board comprising:

conductive bodies that serve as part of a wiring;

an insulating member that covers at least one part of at least one of lateral surfaces of the respective conductive bodies; and an insulating light-reflecting layer disposed on a surface of the wiring board, the insulating light-reflecting layer partially covering and partially exposing the conductive bodies wherein the insulating member has at least one opening, wherein adjacent ones of the conductive bodies are joined to each other at the at least one opening, and wherein an upper surface of each of the conductive bodies and an upper surface of the insulating member are substantially flush.

20. A wiring board comprising:

conductive bodies that serve as part of a wiring;

an insulating member that covers at least one part of at least one of lateral surfaces of the respective conductive bodies;

a metal film provided on or above a surface of the conductive bodies; and an insulating light-reflecting layer disposed on a surface of the wiring board, the insulating light-reflecting layer partially covering and partially exposing the metal film, wherein the insulating member has at least one opening, wherein adjacent ones of the conductive bodies are joined to each other at the at least one opening, and wherein an upper surface of each of the conductive bodies and an upper surface of the insulating member are substantially flush.

\* \* \* \* \*